(12) United States Patent
Pritchard

(10) Patent No.: US 6,631,195 B1
(45) Date of Patent: Oct. 7, 2003

(54) SPEAKER ATTENUATION FOR PRACTICING A MUSICAL INSTRUMENT

(76) Inventor: Eric K. Pritchard, 290 Pritchard La., Berkeley Springs, WV (US) 25411

( * ) Notice: Subject to any disclaimer, the term of this patent is extended or adjusted under 35 U.S.C. 154(b) by 0 days.

(21) Appl. No.: 09/172,559

(22) Filed: Oct. 14, 1998

(51) Int. Cl.$^7$ ............................................... H03F 21/00
(52) U.S. Cl. ........................................ 381/120; 381/98
(58) Field of Search ................................ 381/102, 101, 381/103, 104, 120, 119, 98; 333/14

(56) References Cited

U.S. PATENT DOCUMENTS

| | | | |
|---|---|---|---|
| 3,903,485 A | * 9/1975 | Dolby | ............................ 333/14 |
| 4,490,843 A | * 12/1984 | Bose | ............................ 381/102 |
| 4,937,874 A | * 6/1990 | Pittman | ............................ 381/98 |
| RE37,223 E | * 6/2001 | Bose et al. | ............................ 381/102 |

OTHER PUBLICATIONS

"Audio Cyclopedia" by Howard M. Tremaine, 1969, Second Edition, pp 1144 (includes chart 1 and chart 2).*

* cited by examiner

*Primary Examiner*—Minsun Oh Harvey

(57) ABSTRACT

Speaker attenuation for practicing a musical instrument is a filter means connected between an amplifier and a speaker for providing greater treble attenuation than bass attenuation to compensate for bass hearing loss at attenuated sound levels. The reduction of load created by the attenuator is compensated by a load means.

20 Claims, 1 Drawing Sheet

SPEAKER ATTENUATION FOR PRACTICING A MUSICAL INSTRUMENT

BACKGROUND

The speaker attenuation for practicing a musical instrument is an attenuator for reducing the sound pressure level of an amplifier that compensates for the changing hearing capability as described in the Fletcher-Munson curves such as found in the *Radiotron Designer's Handbook, Radio Corporation of America*, 1953, pg 826. Consequently, this invention is related to loudness attenuators, attenuators connected between amplifiers and speakers, and reactive amplifier loads.

There are other attenuators which are connected between an amplifier and a speaker. The most notable is the crossover. The crossover keeps audio signals nominally out of the range of the speaker or driver from going to a speaker and directing those audio signals to another speaker or driver. The filters in these crossovers are low-pass for woofers, band-pass for mid-range drivers; and high-pass for tweeters.

Another attenuator which is connected between an amplifier and a speaker is the resistive pad which has no frequency characteristics. These pads are found in public address systems and found in guitar amplifier "power soaks". Some of these power soaks even have reactive networks to emulate the load of a speaker or driver. These reactive networks resonate at typical speaker resonances, about 90 Hertz.

THE OBJECTS OF THE INVENTION

The object of this invention is a loudness attenuator connected between the amplifier and speaker which is selectively used for practicing and other low-level activities wherein the treble frequencies are attenuated more than bass frequencies with a filter whose attenuation becomes asymptotic to a constant attenuation at treble audio frequencies.

The object of this invention is a speaker attenuation network for attenuating the audible output of an amplifier and for driving a speaker comprising a resistor and capacitor network having a greater treble attenuation than bass attenuation and having a frequency of high rate of change of attenuation which has a higher rate of attenuation change than at the ends of the audible frequency range.

A second object of this invention is simulating a speaker load for an amplifier.

THE PRIOR ART

Figure 1:
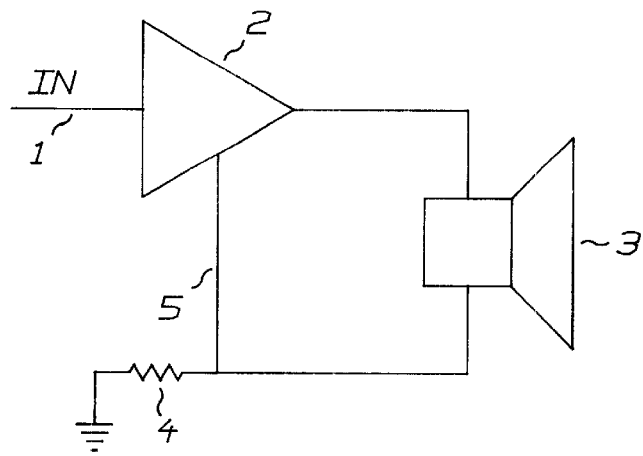
FIG. 1 is a schematic of the prior art.

FIG. 1 shows the prior art amplifier 2 having an input 1 for receiving an input signal and driving a speaker 3. Optionally, the resistor 4 senses the current in the speaker to produce current feedback 5 to amplifier 2. When this amplifier is driven to clipping it produces a power dependent upon the amplifier clipping level. The clipping level is generally determined by the power supply but can be lowered by special circuitry such as in my co-pending patent, Variable And Reactive Audio Power Amplifier, Ser. No. 08/607,450 now U.S. Pat. No. 5,761,316.

The Preferred Embodiment

Figure 2:
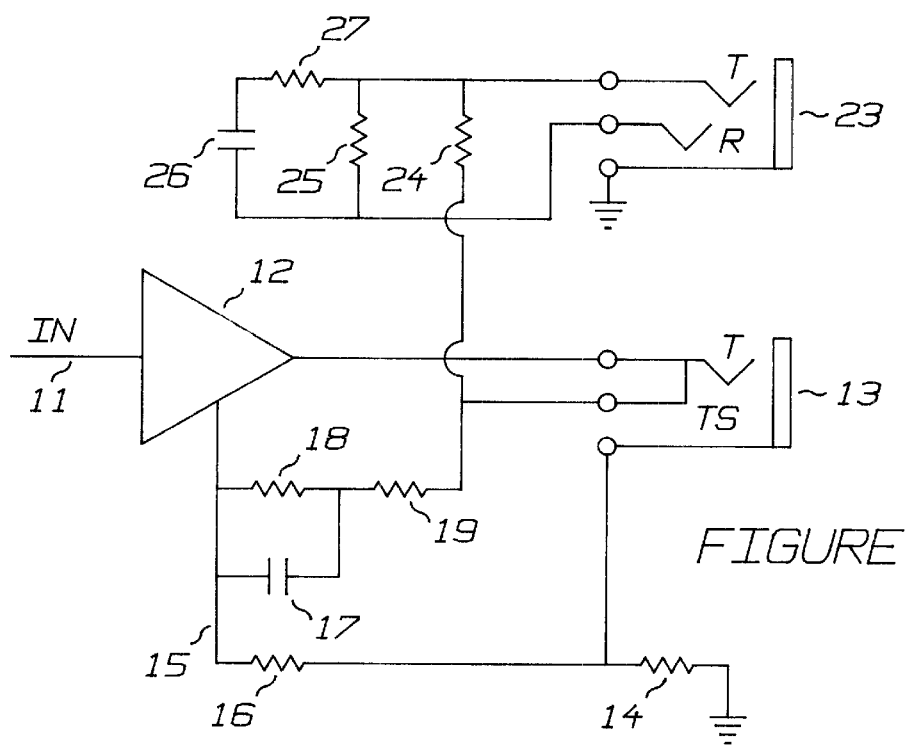
FIG. 2 is a schematic of the preferred embodiment.

The preferred embodiment shown in FIG. 2 uses amplifier 12 having an input 11 for driving a speaker via connecting jack 13. The sleeve contact is connected to the current sense resistor 14 to produce the current feedback signal 15. When driving the speaker via jack 13, the network 16–19 and 24–27 is not connected and does not affect the current feedback signal. When the speaker connecting plug is removed from jack 13, the network 16–19 becomes active. This network loosely emulates the loading of the amplifier by the speaker. The low-frequency attenuation of resistors 16, 18, and 19 produces a feedback signal 15 similar to the feedback signal created by the speaker at resonance. The resistors 16 and 19 produces a feedback signal 15 similar to the feedback signal created by the speaker at middle frequencies. The capacitor 17 sets the breakpoint frequencies in the change from one type of feedback to the other. Obviously, this network could be made more accurate by a resonant filter, however this has not been found to be necessary. Secondly, if the speaker resonance is below the frequency of interest, the capacitor 17 and resistor 18 may be replaced by a short.

When the speaker connecting plug is removed from jack 13 and plugged into jack 23, the sleeve connects resistor 25 and capacitor 26 to ground and thereby enables the network 24–27 for the attenuation of audible signals. The resistors 24, 25, and 27 and the speaker impedance set the high frequency or treble attenuation. The resistors 24 and 25 and the speaker impedance set the low frequency or bass attenuation. The capacitor 26 sets the frequency range of the change between these attenuations which has a frequency of high attenuation change. Notice that the rate of change of the attenuation at both the low end and the high end of the audible range is lower than the rate of change of attenuation at said frequency of high attenuation change. In fact the attenuation becomes asymptotic to a constant attenuation at the extremes of the audio range, and in particular, in the treble region.

The intent of the speaker attenuation network is to approximate the differences in attenuations in the appropriate Fletcher-Munson curves. The first appropriate curve is at the nominal full-power output of the amplifier. The second is at the nominal attenuated power output when the attenuator is included. Since the Fletcher-Munson curves are quite similar in the treble region, the above powers are in the treble region, ie. above 1,000 Hertz.

As recommended by the Fletcher Munson curves, the upper frequency of the change of attenuations is about 400 Hertz. The preferred values for a 4 ohm speaker are 40 ohms for resistor 24, 5 ohms for resistor 25, 3.9 ohms for resistor 27, and 100 microfarads for capacitor 26. This provides an upper frequency time constant of about 400 microseconds or about 400 Hertz.

The above described network emulates the Fletcher-Munson curves below 1,000 Hertz because the bass portions of these curves vary considerably. It is not necessary to emulate these curves above 1,000 Hertz since the treble portions of the various curves are quite similar.

Notice that the output impedance of this network is several times the nominal impedance of the speaker, in this example the ratio is 2.7 times.

The Second Embodiment

Figure 3:
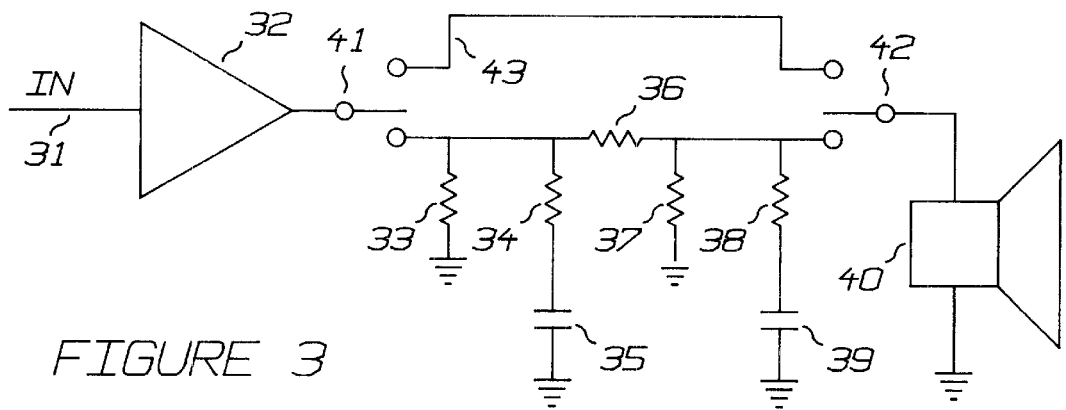
FIG. 3 is a schematic of a second embodiment.

The second embodiment is similar to the preferred embodiment but uses a speaker load network to load the amplifier in lieu of emulating the load as shown in FIG. 2. FIG. 3 shows an amplifier 32, vacuum tube amplifier for example, with input 31. The output is connected to a load network 33–35 with switch 41, attenuation network 36–39, switch 42, and speaker 40. The load network 33–35 presents, to the amplifier, a low impedance load created by resistors 33 and 34 at high frequencies and a higher impedance load created by resistor 33 at low frequencies. Resistor 33 is several times the nominal impedance of the speaker. The parallel combination of resistors 33 and 34 is approximately the nominal impedance of the speaker. The capacitor 36 sets the change in attenuation over a frequency range set by these impedances. The lower frequency is approximately that of the resonant frequency of the speaker being emulated. Then components 36–39 operate as network 24–27 to attenuate the amplifier signal according to a Fletcher-Munson curve. The capacitor 39 works with the remaining components to define a frequency of high rate of change of attenuation. This frequency is below 400 Hertz. Additionally, the rate of attenuation at this frequency is higher than the rate of attenuation at the ends of the audible range.

When the double pole double throw switch 41 and 42 is thrown, the practice circuit is disabled and amplifier 32 is connected directly to the speaker 40 via wire 43. Like the use of jacks 13 and 23 in FIG. 2, this provides selectability.

FIG. 3 has the disadvantage of needing high power resistors for resistors 33 and 34 as well as 36. Of the corresponding resistors in FIG. 2, only resistor 24 needs to dissipate over 2 watts.

Filter Design

The normal output of an instrument amplifier and speaker is about 115 dBa. Compared at the standard frequency of 1,000 Hertz, the bass frequencies at that level are more easily heard than at more reasonable sound pressure levels. In fact, the hearing is nearly flat in the bass region between 100 to 110 dBa. When the treble region is attenuated, the bass region can not be attenuated as much to maintain good tone balance. The filter needs to compensate for the change in hearing capability by attenuating the treble more.

The filter between the amplifier and the speaker is found in systems of speakers. A speaker in a system of speakers does not receive all frequencies produced by the amplifier. A two speaker system has a speaker for bass frequencies and another for treble frequencies. The filters used are a low-pass for the bass speaker and a high-pass for the treble speaker. Three- and more-way systems use band-pass filters between that have center frequencies between the cutoff frequencies of the low-pass and high-pass filters. The attenuation of band-pass filters keeps getting larger at the extremes of the audio range. The attenuation of both the low-pass filters and the high-pass filters become asymptotic to a constant, near-zero attenuation. The present invention requires a filter that has an attenuation which becomes asymptotic to a constant substantial attenuation. It becomes asymptotic to a substantial attenuation in the treble region and generally asymptotic to a lessor attenuation in the low bass frequencies.

Of course other networks and circuits are quite possible and the limitations are only in the claims below.

What is claimed is:

1. A speaker attenuation network for attenuating the audio output of an amplifier for driving a speaker at a lower level with bass compensation comprising
  a load means representing the load of a speaker for loading said amplifier; and
  filter means for connecting said amplifier and said speaker without an intervening amplifier and having a frequency response which attenuates bass audio frequencies by a first amount, and which increases attenuation relative to said first amount over a frequency region such that treble audio frequency attenuation is greater than bass audio frequency attenuation, wherein the attenuation level of frequencies above said region becomes asymptotic to a substantially constant value which is greater than said first amount.

2. The speaker attenuation network of claim 1 wherein said load means approximates the loading effects of speaker resonance.

3. The speaker attenuation network of claim 1 wherein said load means approximates the loading effects with a network composed of resistors and capacitors which produces less loading in the bass frequencies around 100 Hertz than in the treble frequencies of 400 Hertz and more.

4. The speaker attenuation network of claim 1 wherein said filter and load are either connected to said amplifier and speaker or said amplifier is connected to said speaker without said load and filter by a switch means.

5. The speaker attenuation network of claim 1 wherein said filter and load are either connected to said amplifier and speaker or said amplifier is connected to said speaker without said load and filter by connector means switching.

6. The speaker attenuation network of claim 1 wherein said amplifier includes current feedback and said load means simulates a speaker load and said current feedback is responsive to said load means.

7. The speaker attenuation network of claim 6 wherein said filter and load are connected or not connected by connector means switching.

8. A speaker attenuation network for attenuating the audio output of an amplifier and for driving a speaker comprising
  a first resistor means for connection to said amplifier and said speaker and providing a bass attenuation; and
  a capacitor means connected to said first resistor means for providing a greater treble attenuation; wherein
  said capacitor means creates an audio frequency of high rate of change of attenuation which is below 400 Hertz; and wherein
  the rate of change of attenuation above and below said frequency approaches a constants value.

9. The speaker attenuation network of claim 8 which includes said load means for said amplifier which approximates the loading effects of speaker resonance.

10. The speaker attenuation network of claim 8 which includes load means which approximates the loading effects with network composed of resistors and capacitors which produces less loading in the bass frequencies around 100 Hertz than in the treble frequencies of 400 Hertz and more.

11. The speaker attenuation network of claim 8 wherein said network is either connected to said amplifier and speaker or said amplifier is connected to said speaker without said network by a switch means.

12. The speaker attenuation network of claim 8 wherein said network is either connected to said amplifier and speaker or said amplifier is connected to said speaker without said network by connector means switching.

13. The speaker attenuation network of claim 8 which includes load means which simulates a speaker load; and said amplifier includes current feedback means responsive to said load means.

14. The speaker attenuation network of claim 13 wherein said network and load are either connected to said amplifier and speaker or said amplifier is connected to said speaker without said network and filter by connector means switching.

15. The speaker attenuation network of claim 8 wherein said capacitor means includes a second resistor means connected in series.

16. An audio amplifier means for driving a speaker an amplifier means for driving said speaker having a first maximum treble sound pressure level;

a filter means selectively connected between said amplifier and said speaker for producing a second maximum treble sound pressure level; wherein said filter attenuation approximates the difference between the Fletcher-Munson curves for said first and second maximum treble sound pressure level.

17. The audio amplifier means of claim 16 which includes load means for simulating a speaker load.

18. The audio amplifier means of claim 16 which includes connector means for selectively connecting said amplifier to said speaker to produce said first maximum treble sound pressure level or for connecting said amplifier to said speaker through said filter means for producing said second maximum treble sound pressure level.

19. The audio amplifier means of claim 16 which includes load means which simulates a speaker load; and said amplifier includes current feedback means responsive to said load means.

20. The audio amplifier means of claim 19 wherein said filter and load are either connected to said amplifier and speaker or said amplifier is connected to said speaker without said load and filter by a switch means.

* * * * *